(12) United States Patent
Butterworth et al.

(10) Patent No.: US 10,706,859 B2
(45) Date of Patent: Jul. 7, 2020

(54) TRANSPORT OF AUDIO BETWEEN DEVICES USING A SPARSE STREAM

(71) Applicant: Apple Inc., Cupertino, CA (US)

(72) Inventors: Ashley I. Butterworth, Santa Clara, CA (US); Matthew X. Mora, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/612,569

(22) Filed: Jun. 2, 2017

(65) Prior Publication Data

US 2018/0350374 A1 Dec. 6, 2018

(51) Int. Cl.
| | |
|---|---|
| *G10L 19/008* | (2013.01) |
| *G10L 25/78* | (2013.01) |
| *H03M 7/30* | (2006.01) |
| *H04N 21/81* | (2011.01) |
| *H04L 29/06* | (2006.01) |
| *H04N 21/439* | (2011.01) |

(52) U.S. Cl.
CPC ......... *G10L 19/008* (2013.01); *H03M 7/3062* (2013.01); *H04L 65/605* (2013.01); *H04L 65/80* (2013.01); *H04N 21/4398* (2013.01); *H04N 21/8106* (2013.01)

(58) Field of Classification Search
CPC ..... G10L 19/008; G10L 19/167; G10L 25/78; G10L 25/87; H04H 20/33; H04N 21/4398
USPC ......... 704/210, 215, 500, 501, 205; 381/1, 2
See application file for complete search history.

(56) References Cited

U.S. PATENT DOCUMENTS

| | | | |
|---|---|---|---|
| 5,953,049 A | 9/1999 | Horn et al. | |
| 6,233,251 B1 | 5/2001 | Kurobe et al. | |
| 7,532,672 B2* | 5/2009 | Rao | G10L 19/24 |
| | | | 375/259 |
| 7,599,834 B2* | 10/2009 | Raad | H04M 3/568 |
| | | | 704/219 |
| 9,590,910 B1* | 3/2017 | Pannell | H04L 49/201 |
| 9,661,107 B2 | 5/2017 | Kim et al. | |
| 2002/0165718 A1* | 11/2002 | Graumann | G10L 25/78 |
| | | | 704/270 |
| 2003/0212550 A1* | 11/2003 | Ubale | G10L 19/00 |
| | | | 704/215 |
| 2004/0160962 A1* | 8/2004 | Johnston | H04N 21/235 |
| | | | 370/395.5 |
| 2007/0121611 A1* | 5/2007 | Rosenberg | H04L 29/06027 |
| | | | 370/356 |
| 2007/0274540 A1* | 11/2007 | Hagen | H04M 3/569 |
| | | | 381/119 |

(Continued)

OTHER PUBLICATIONS

Wikipedia, "User Datagram Protocol", downloaded Feb. 20, 2019, 4 Pages. (Year: 2019).*

(Continued)

*Primary Examiner* — Martin Lerner
(74) *Attorney, Agent, or Firm* — Womble Bond Dickinson (US) LLP

(57) ABSTRACT

Transportation of audio data is provided between a first network element and a second network element. The first network element divides multichannel audio data by channel into a plurality of individual channels. The first network element packages each of the plurality of individual channels together with a corresponding sampling set of audio data into a single packet. The first network element transmits to the second network element each packet that includes a channel having an active sampling set of audio data.

26 Claims, 4 Drawing Sheets

(56) References Cited

U.S. PATENT DOCUMENTS

| | | | | |
|---|---|---|---|---|
| 2008/0218518 | A1* | 9/2008 | Zhou | G06F 17/11 345/440 |
| 2009/0097503 | A1* | 4/2009 | Jain | G10L 19/008 370/474 |
| 2010/0238792 | A1* | 9/2010 | Togo | H04H 20/12 725/109 |
| 2011/0060599 | A1* | 3/2011 | Kim | G10L 19/00 704/501 |
| 2013/0006622 | A1* | 1/2013 | Khalil | G10L 19/012 704/233 |
| 2013/0223448 | A1* | 8/2013 | Kim | H04N 21/439 370/392 |
| 2014/0093086 | A1* | 4/2014 | Zhao | G10L 19/005 704/500 |
| 2014/0140516 | A1* | 5/2014 | Taleb | G10L 21/04 381/23 |
| 2014/0267905 | A1 | 9/2014 | Lee et al. | |
| 2016/0080447 | A1* | 3/2016 | Williams | H04L 65/4076 370/465 |
| 2016/0133260 | A1* | 5/2016 | Hatanaka | G10L 19/008 381/22 |
| 2017/0041252 | A1 | 2/2017 | Das et al. | |
| 2017/0054649 | A1 | 2/2017 | Mamidwar et al. | |
| 2017/0125027 | A1* | 5/2017 | Filippini | G10L 19/167 |
| 2017/0280389 | A1* | 9/2017 | Guilhaumon | G10L 25/78 |

OTHER PUBLICATIONS

Wikipedia, "Bandwidth (computing)", downloaded Feb. 20, 2019, 4 Pages. (Year: 2019).*

International Standard ISO/IEC 13818-7, "Information technology—Generic coding of moving pictures and associated audio information—Part 7: Advanced Audio Coding (AAC)", ISO/IEC 13818-7:2004(E), Third Edition, Oct. 15, 2004, 206 Pages. (Year: 2004).*

Bharath Sundararaman, et al., "Clock Synchronization for Wireless Sensor Networks: A Survey", University of Illinois at Chicago, Mar. 22, 2005.

Extended European Search Report, dated Oct. 23, 2018, for European Patent application No. 18174714.8.

* cited by examiner

FIGURE 2A
--PRIOR ART--

| ChA | S0 |
| ChB | S0 |
| ChC | S0 |
| ChD | S0 |
| ⋮ | |
| ChA | S7 |
| ChB | S7 |
| ChC | S7 |
| ChD | S7 |

| ChA | S0 |
| ⋮ | |
| ChA | S7 |
| ChB | S0 |
| ⋮ | |
| ChB | S7 |
| ChC | S0 |
| ⋮ | |
| ChC | S7 |
| ChD | S0 |
| ⋮ | |
| ChD | S7 |

| ChA | S0 |
| ⋮ | ⋮ |
| ChH | S0 |
| ⋮ | |
| ChA | S5 |
| ⋮ | ⋮ |
| ChH | S5 |

ChA S0-S5 ← 301A
ChB S0-S5 ← 301B
⋮
ChH S0-S5 ← 301C

TRANSPORT OF AUDIO BETWEEN DEVICES USING A SPARSE STREAM

FIELD

One aspect of the disclosure herein relates to transporting data in a network, and more particularly relates to transporting audio data between devices in the network.

BACKGROUND

When streaming data over a network, technical standards are typically used to govern the transportation of the data between devices in the network. For example, Audio Video Bridging/Time Sensitive Networking (AVB/TSN) standards from the IEEE 802.1 AVB/TSN group provide mechanisms for guaranteeing low latency and sufficient bandwidth of a stream of data traveling over an AVB/TSN network. In addition, the IEEE 1722 (AVTP) standard provides audio, video and other transport protocols which take advantage of the AVB/TSN services to provide low-latency guaranteed streaming of audio, video and other media and control signals over the network.

BRIEF DESCRIPTION OF THE DRAWINGS

The embodiments herein are illustrated by way of example and not by way of limitation in the figures of the accompanying drawings in which like references indicate similar elements. It should be noted that references to "an" or "one" embodiment in this disclosure are not necessarily to the same embodiment, and they mean at least one. Also, in the interest of conciseness and reducing the total number of figures, a given figure may be used to illustrate the features of more than one embodiment, and not all elements in the figure may be required for a given embodiment.

FIGS. 2A, 2B and 2C are representational views of conventional data packet structures.

FIG. 3 is a representational view for explaining a data packet structure according to an embodiment herein.

DETAILED DESCRIPTION

Figure 1:
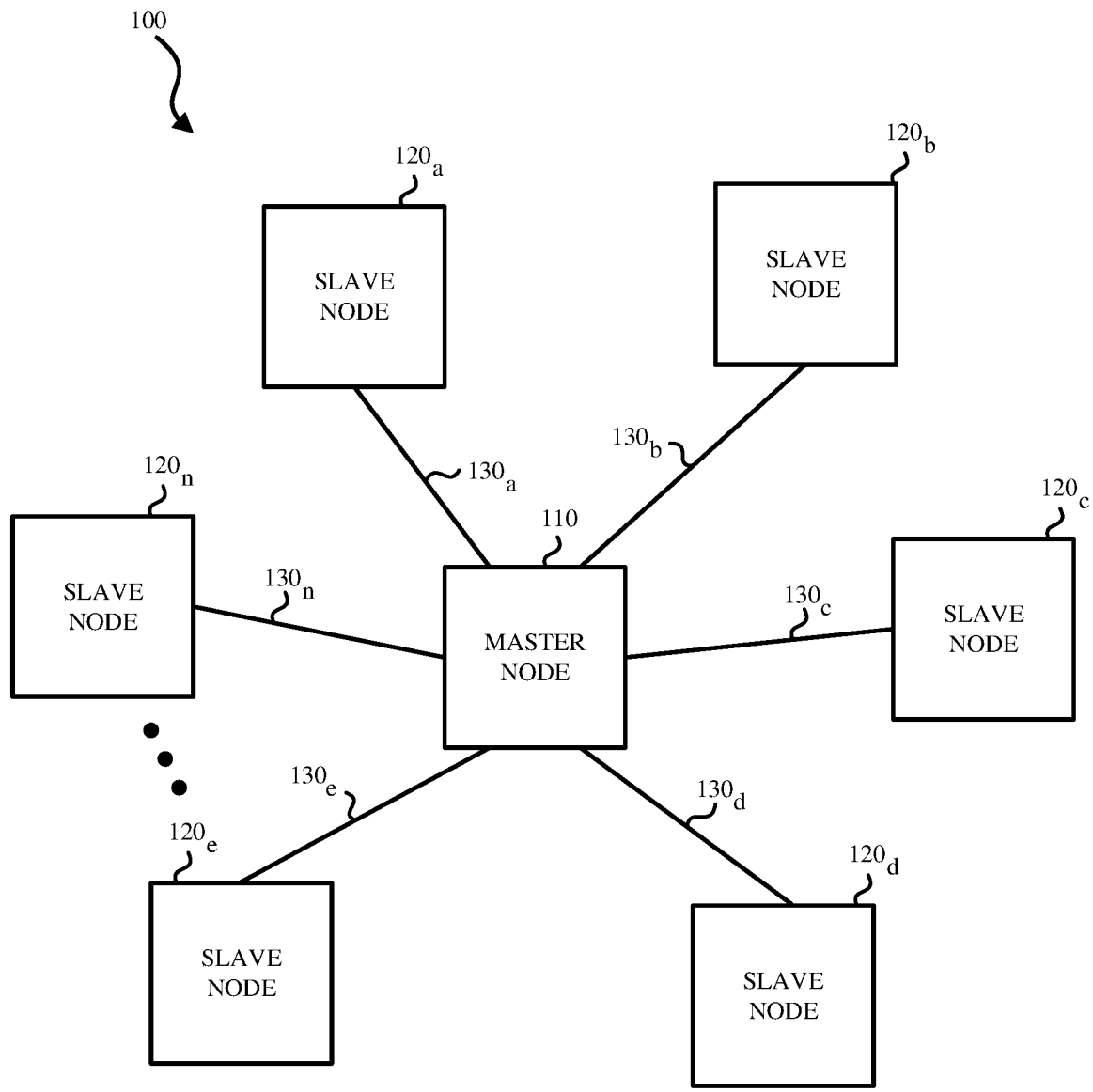
FIG. 1 is a representational view for explaining interconnected nodes in an example network according to an embodiment herein.

Several embodiments are now explained with reference to the appended drawings. Whenever aspects are not explicitly defined, the embodiments are not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to obscure the understanding of this description.

As used herein, the term "network" refers without limitation to any network configured to transfer data as groupings called packets. Packet networks can deliver streams of data (composed sequences of packets) to a community of devices. During transfer, packets are buffered and queued, and may experience variable delays and throughput depending on the traffic load in the network. As used herein, the term "master" or "upstream" node refers to a device or interface configured to packetize information for transfer via a packet-based network. The terms "slave" or "downstream" node refers to a device or interface configured to extract information from a packet. A "node" refers to a device which receives packets, and forwards the packets to another device. The term "timestamp" refers to any indication (sequence of characters or encoded information) of when a certain event occurred as determined by a clock of a node. These definitions are not considered to be limiting and are made only to clarify various aspects discussed herein.

Conventionally, sending audio data for a plurality of audio channels of an audio system often requires generation of a packet and negotiation of the size of the packet in order to reserve the appropriate amount of bandwidth. Typically, the packet size (e.g., number of samples in the packet) is fixed for the life of an audio stream. If the packet size needs to be increased or decreased, the bandwidth size must be renegotiated. During playback of an audio signal, audio data for all of the reserved bandwidth channels is typically transmitted, regardless of whether the audio data for a particular channel includes sound.

An embodiment herein aims to dynamically size a packet, such that bandwidth does not have to be renegotiated. According to one aspect, only audio data for the plurality of audio channels including sound are transmitted during playback, and the audio data for the plurality of audio channels not including sound are not transmitted. The packet size is therefore dynamically sizeable since the number of samples being transmitted in the packet may be varied according to whether sound is present for a particular audio channel.

Thus, all of the audio data for the plurality of audio channels is transmitted only in a case where every channel includes audio data having active sound. In cases where not all of the audio data for the plurality of channels includes sound (and is therefore not transmitted), the unused bandwidth may be made available for use by the audio system to send other data traffic without having to change a bandwidth request. In addition, the initially reserved bandwidth remains guaranteed, such that if all of the audio data for the plurality of audio channels includes sound and is therefore transmitted, it is unnecessary to perform another bandwidth reservation (at the risk of denial).

Conventionally, in transporting audio data in a network, all audio channels are packaged into a single packet. In one case, the audio data can be sent in an interleaved format. In the interleaved format, all audio samples for every channel at the same sampling instant are sent contiguously followed by all of the samples for every channel of the next sampling instant. FIG. 2A illustrates an example packet 201A having an interleaved format, where audio data for the plurality of audio channels is interleaved, for an audio system having 4 audio channels each with 8 samples. The packet may include a header. In particular, FIG. 2A shows an example data packet 201A for four channels (Channels A to D) and eight sample instants (S0 to S7). As shown in FIG. 2A, the sampling instant S0 for Channel A is provided first, the sampling instant S0 for Channel B is provided next, and then Channel C and D. Then, the next sampling instant S1 for Channel A is provided, and so on, until all of the eight sample instants have been provided for each of Channels A to D. Typically, the amount of needed bandwidth may be determined from the size of the packet. It is noted that although FIG. 2A illustrates four channels and eight sample instants, any number of channels and sample instants may be used.

In another case, the audio data can be sent in a non-interleaved format. In the non-interleaved format, all samples for a first channel are sent, followed by all samples for a second channel, etc. FIG. 2B illustrates an example packet 201B having a non-interleaved format, in which a sequence of samples for Channel A are followed by a sequence of samples for Channel B, and so on. Typically, interleaved format is used by audio systems, rather than non-interleaved format, since the audio channels are often needed by the audio system contemporaneously. In particular, FIG. 2B shows an example data packet 201B for four channels (Channels A to D) and eight sample instants (S0 to S7). As shown in FIG. 2B, the sampling instant S0 for Channel A is provided first, the sampling instant S1 for Channel A is provided next, and then sampling instants S2 to S7 for Channel A. Then, sampling instants S0 to S7 for Channel B are provided, and so on, until all of the eight sample instants have been provided for each of Channels A to D.

In each of the cases shown in FIGS. 2A and 2B, packetization of the data follows a set pattern of a fixed number of samples and a fixed number of channels per packet. For instance, in a conventional AVB system, there would be 6 samples per packet for n channels with 1 packet per 125 μs. The inventors herein have found that, in the conventional approach of streaming audio data, the stream may always contain n channels worth of samples even if there is only audio present on a subset of channels, which can result in always using the maximum amount of bandwidth for the stream.

An embodiment herein addresses the foregoing to provide a more efficient utilization of the amount of bandwidth for the stream by only transmitting packets that include a channel having an active sampling set of audio data. In this embodiment, audio data is transported between a first network element and a second network element. In particular, the first network element divides multichannel audio data by channel into a plurality of individual channels. The first network element packages each of the plurality of individual channels together with a corresponding sampling set of audio data into a single packet. The first network element transmits to the second network element each packet that includes a channel having an active sampling set of audio data.

In one embodiment, only those packets including channels having an active sampling set of audio data are transmitted by the first network element to the second network element.

In one embodiment, a packet is not transmitted by the first network element if the packet doesn't include an active channel. In this embodiment, a channel is explicitly chosen by the system setup to be active or not depending on whether audio is being sourced to the channel. In this case, a packet for a particular channel may be silent because it is active but there is not any audio (e.g., having an 8 channel stream but only using 2 channels actively, so 6 of the channels are inactive and data packets for the 6 inactive channels will not be sent). In the foregoing, it is noted that the 2 active channels may have silence on them.

In another embodiment, a level detector and/or silence detector chooses active and inactive channels based on whether all of the audio is silent, where data packets are not sent if all of the audio is silent. For example, an analogue level detector can be used to choose active and inactive channels, treating really low levels of noise as silence.

In one embodiment, each packet can also include position and motion information for the channel included in the packet. The format of the packet can be extracted to include position and motion information for each channel to enable systems where audio playback is from a composition that is then rendered within the node as appropriate for a particular speaker.

In an AVB/TSN network, the bandwidth reservation and traffic shaping system allocate and guarantee bandwidth for reserved flows such as audio data. However, the inventors herein have found that if a reserved flow is not using all of the allocated bandwidth, best effort traffic (e.g., email, web browsing, etc.) can still use that bandwidth but will get automatically throttled back when the reserved traffic starts to use the allocated bandwidth.

By virtue of the arrangements described herein, it is possible to take advantage of the foregoing finding when using streams that can have a variable number of channels active at any time. This can be achieved by using a sparse stream format which, unlike a traditional stream format, uses a single packet per channel, splitting up the channels into multiple packets instead of a single packet. The source of the stream then sends packets only for the channels that have active audio, with at least one channel's audio being transmitted in every transmission period to maintain the media clock.

In an example mixed environment such as a home, the system might reserve the bandwidth for a full 128 sound sources which would only be used in a small portion of a movie or song. Using the sparse stream format provides the advantageous effect of efficiently utilizing the bandwidth by utilizing all of the allocated bandwidth when the movie or song calls for the sounds, and allowing other users to utilize the bandwidth during the rest of the movie or song where far fewer channels are needed.

FIG. 1 is a representational view illustrating interconnected nodes in a first example network according to an embodiment herein. In the illustrated embodiment, the network 100 includes a master node 110 in communication with a number of slave nodes 120 (individually slave nodes 120a, 120b, 120c, 120d, 120e . . . 120n) through links 130 (individually links 130a, 130b, 130c, 130d, 130e . . . 130n), respectively. Nodes 110 and 120 are, for example, servers, computers (desktop, laptop, handheld, etc.), routers, firewalls, gateways, network and personal media devices, electronic devices and mobile devices, etc.

Each of nodes 110 and 120 is generally a time-aware system including its own local clock source, and each of slave nodes 120 is capable of synching its own local clock with the clock of a node that has been designated as a master node (such as master node 110.) Each of nodes 110 and 120 generates a timestamp using its clock and a type of time-stamping process, such as a hardware-implemented process or a software-implemented process. For example, with respect to hardware-implemented timestamping, when a message departs from or arrives at a node, special hardware generates a timestamp from the local clock. With respect to software-implemented timestamping, when a message reaches the application layer of a node, a processor executes a software program or computer-executable method stored in a memory in order to generate a timestamp based on the local clock. Generally, a timestamp generated by a hardware-implemented process is more accurate than a timestamp generated by a software-implemented process. In one embodiment, timestamps formats are implemented in nanoseconds.

Links 130 are of a wired type or a wireless type. In one embodiment, links 130 are Ethernet links, and master node 110 and slave nodes 120 are Ethernet based media devices.

Each type of link between master node 110 and slave nodes 120 has different accuracy metrics for performance of time synchronization. For example, a timestamp provided in a time synchronization message over a wired link type is typically more accurate than a timestamp provided in a time synchronization message over a wireless link type. Using links 130, master node 110 and slave nodes 120 exchange messages in order to perform audio transmission and playback. In one embodiment, master node 110 transmits audio data for a plurality of audio channels to one or more of slave nodes 120 according to processes described herein (e.g., process 400 described in connection with FIG. 4). In one embodiment, master node 110 and slave nodes 120 operate in accordance with the IEEE 1722 standard and the IEEE 802.1 standard.

Although FIG. 1 illustrates an example network configuration, it will be understood that the disclosure herein relates to any configuration of networks, including point-to-point networks, networks connected by a bus, star networks, ring networks, mesh networks, hybrid networks, and daisy chain networks.

FIG. 3 is a representational view of data packet structures (data packets 301A, 301B and 301C) according to an embodiment herein. For illustrative purposes, the data packets 301A to 301C are for six samplings (S0-S5) and eight channels (Channels A to H). Each sample may be, for example, 16, 24, or 32 bits, and may be, for example 125 microseconds (vs) of audio data. In this regard, FIG. 2C shows a conventional data packet 201C having an interleaved format, also including six samplings (S0-S5) for eight channels (Channels A to H).

As shown in FIG. 3, each channel of Channels A to H is separated into a single data packet, resulting in multiple data packets 301A to 301C. In each of data packets 301A to 301C, a set of samples (S0-S5) is included which corresponds to the particular channel included in the data packet. For example, data packet 301A includes samples S0-S5 corresponding to Channel A, data packet 301B includes samples S0-S5 for Channel B, etc., and data packet 301C includes samples S0-S5 for Channel H. Of course, the embodiment is not limited to eight channels and six samples, and any other number of channels and samples can be used. The format of the packets would be, for example, similar to a single channel AVTP Audio Format packet as described in IEEE 1722-2016; but for an n channel stream there would be 1-n of them per 125 μs (or appropriate period for the sample rate).

Thus, according to the embodiment of FIG. 3, rather than packaging all of the audio channels into a single packet, each channel is packaged into its own single leaved-single channel packet. As described above, FIG. 3 illustrates an example of this embodiment, in which samples S0-S5 for Channel A have been packaged into packet 301A, samples S0-S5 for Channel have been packaged into packet 301B . . . samples S0-S5 for Channel H have been packaged into packet 301C, etc. According to one embodiment, only the packets including channels that include sound are transmitted. For example, if it is determined that Channel A and Channel H include sound, only packets 301A and 301C are transmitted, and packet 301B is not transmitted.

Figure 4:
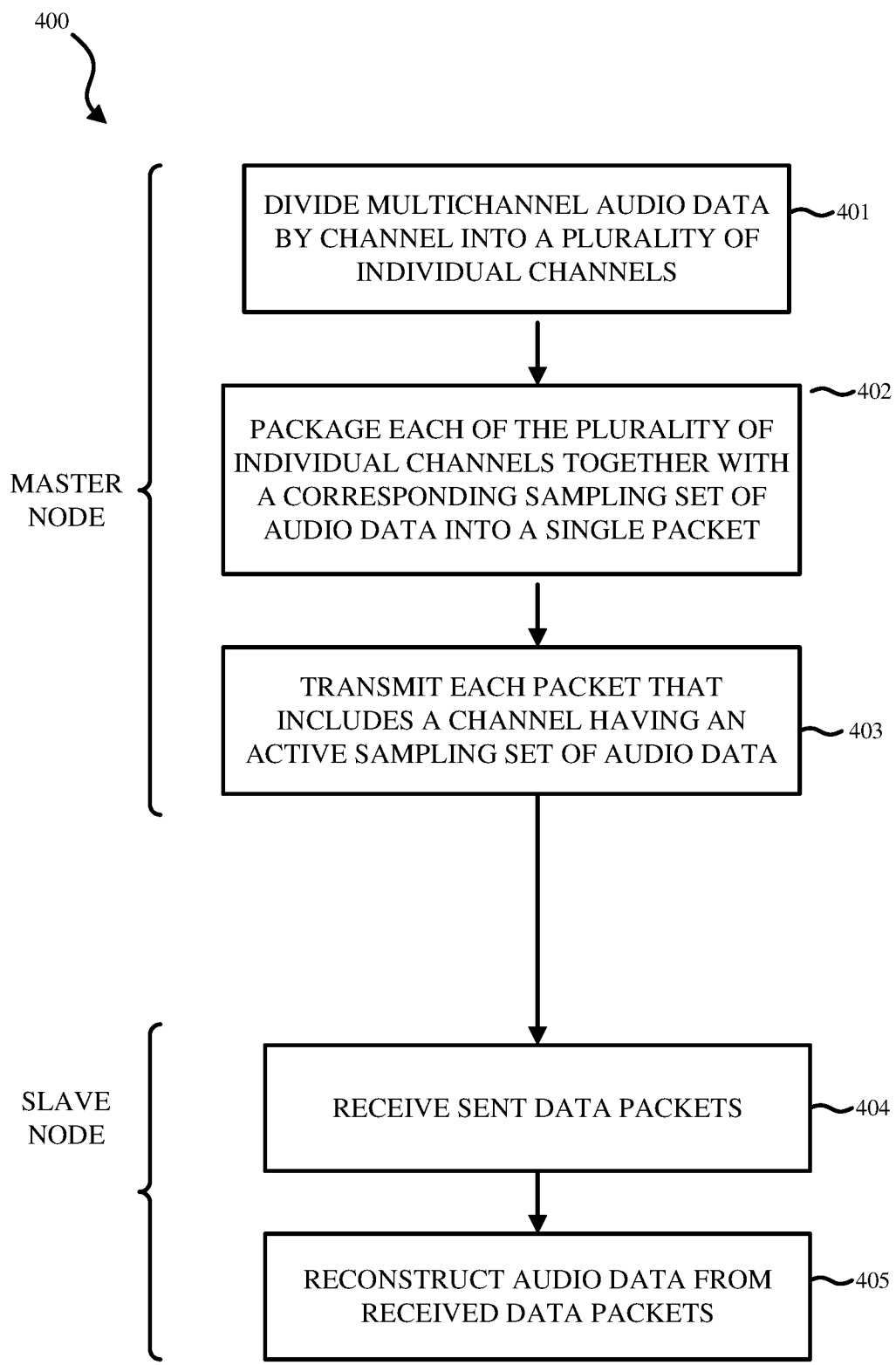
FIG. 4 is a flow diagram for explaining a process of transporting audio data between a first network element and a second network element according to an embodiment herein.

FIG. 4 is a flow diagram illustrating a process of audio streaming between a master node and a slave node according to an embodiment herein. In this regard, the following embodiments may be described as a process 400, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc. Process 400 may be performed by processing logic that includes hardware (e.g. circuitry, dedicated logic, etc.), software (e.g., embodied on a non-transitory computer readable medium), or a combination thereof.

In one example embodiment, process 400 is executed by master node 110 and one or more of slave nodes 120. In this regard, although process 400 of FIG. 4 is described in connection with the network configuration illustrated in FIG. 1, it should be understood that the process may be applied to other network configurations, including without limitation to network 100 of FIG. 1.

Referring to FIG. 4, at block 401 master node 110 divides multichannel audio data by channel into a plurality of individual channels. For example, as described above in connection with FIG. 3, Channels A to H are divided into 8 separate data packets (e.g., data packets 301A thru 301C). At block 402, the master node 110 packages each of the plurality of individual channels together with a corresponding sampling set of audio data (e.g., S0-S7 described above in connection with FIG. 3) into a single packet. At block 403, the master node 110 transmits to one or more of the slave nodes 120 each packet that includes a channel having an active sampling set of audio data.

In one embodiment, a packet is not transmitted by the master node 110 if the packet doesn't include an active channel. In this embodiment, a channel is explicitly chosen by the system setup to be active or not depending on whether audio is being sourced to the channel. In this case, a packet for a particular channel may be silent because it is active but there is not any audio (e.g., having an 8 channel stream but only using 2 channels actively, so 6 of the channels are inactive and data packets for the 6 inactive channels will not be sent). In the foregoing, it is noted that the 2 active channels may have silence on them.

In another embodiment, a level detector and/or silence detector included in the master node 110 chooses active and inactive channels based on whether all of the audio is silent, where data packets are not sent if all of the audio is silent. For example, an analogue level detector can be used to choose active and inactive channels, treating really low levels of noise as silence.

At block 403, the master node 110 transmits each of the data packets on a single stream. The active sampling set of audio data can include at least one sampling instant of sound. In one embodiment, during streaming, the master node 110 transmits at least one packet during each transmission period.

Thus, during playback, a number of channels corresponding to the number of the plurality of split audio channels is reserved. However, only packets that are non-silent are transmitted to meet the maximum channel bandwidth reserved. Accordingly, the unused bandwidth may be made available for use by the transmitting device.

At block 404, the slave 120 receives the data packets sent by the master node 110. Each packet may include a channel identifier for placing the audio data included in the packet at the second network element. At block 405, the slave 110 reconstructs the audio data from the received data packets based on the channel identifiers included in the data packets. If a data packet is not received for a particular channel or channels, the slave node 120 knows to provide silence for the particular channel or channels.

Figure 5:
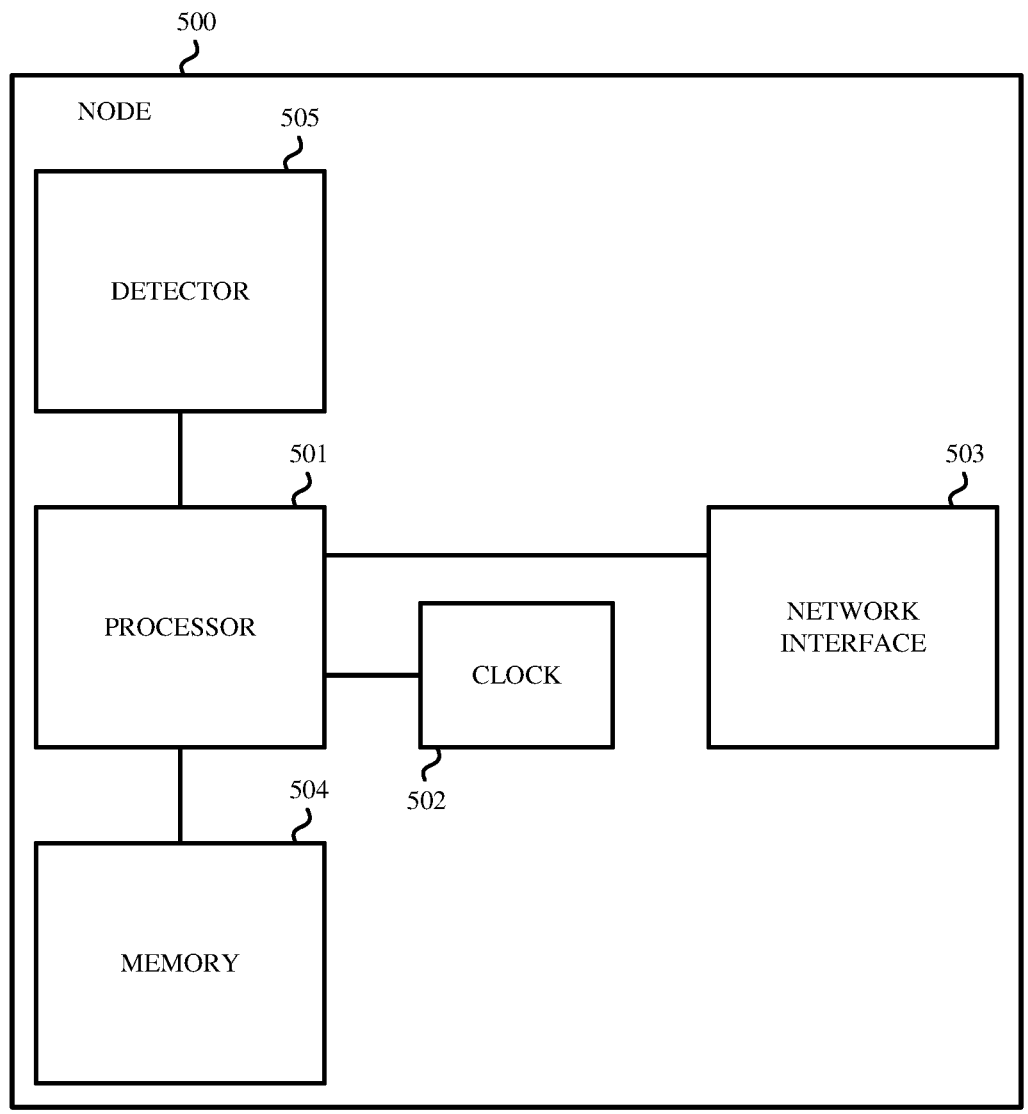
FIG. 5 is a representational view for explaining an example node according to embodiments herein.

FIG. 5 is a representational view illustrating an example node 500 according to embodiments herein. Node 500 is an example of nodes 110 and 120 used for implementing the techniques disclosed herein. Node 500 includes a processor 501, which can include one or more processing devices. Examples of processor 501 include without limitation a microprocessor, an application-specific integrated circuit (ASIC), a state machine, or other suitable processing device. Processor 501 is communicatively coupled to a computer-readable storage medium, such as memory 504, and accesses information stored in memory 504, such as timestamps and chain of quality information. Memory 504 also stores computer-executable instructions that when executed by processor 501 cause the processor 501 to perform the operations described herein. Memory 504 may be, for example, solid-state memories, optical and magnetic media or any other non-transitory machine-readable medium. Non-limiting examples of memory 504 include a hard drive, compact disc, flash memory, non-volatile memory, volatile memory, magnetic disk(s), etc. Node 500 also includes a network interface 503 for communicating with other nodes of the network, and clock 502 for generating timestamps. As discussed above, clock 502 may be implemented by hardware or by software. Node 500 also includes a detector 505 such as a level detector, a silence detector or analogue detector for detecting sound for channels.

FIG. 5 is merely one example of a particular implementation and is merely to illustrate the types of components that may be present in a node. While the node 500 is illustrated with various components, it is not intended to represent any particular architecture or manner of interconnecting the components; as such details are not germane to the embodiments herein. It will also be appreciated that network computers, handheld computers, mobile phones, servers, and/or other data processing systems which have fewer components or perhaps more components may also be used with the embodiments herein. Accordingly, the processes described herein are not limited to use with the hardware and software of FIG. 5.

The processes and blocks described herein are not limited to the specific examples described and are not limited to the specific orders used as examples herein. Rather, any of the processing blocks may be re-ordered, combined or removed, performed in parallel or in serial, as necessary, to achieve the results set forth above. The processing blocks associated with implementing the structures and processes disclosed herein may be performed by one or more programmable processors executing one or more computer programs stored on a non-transitory computer readable storage medium to perform the functions of the system. All or part of the network may be implemented as, special purpose logic circuitry (e.g., an FPGA (field-programmable gate array) and/or an ASIC (application-specific integrated circuit)). All or part of the network may be implemented using electronic hardware circuitry that include electronic devices such as, for example, at least one of a processor, a memory, a programmable logic device or a logic gate. Further, processes can be implemented in any combination hardware devices and software components.

While certain embodiments have been described and shown in the accompanying drawings, it is to be understood that such embodiments are merely illustrative of and not restrictive, and the embodiments are not limited to the specific constructions and arrangements shown and described, since various other modifications may occur to those of ordinary skill in the art. The description is thus to be regarded as illustrative instead of limiting.

The invention claimed is:

1. A method for transporting audio data between a first network device and a second network device, the method comprising:
   dividing, by the first network device, multichannel audio data by channel into a plurality of individual channels;
   determining, during a system setup whether an entirety of an individual channel from the plurality of channels is an active channel depending on whether audio is being sourced to the individual channel for each individual channel from the plurality of channels;
   packaging, by the first network device, in response to determining whether each individual channel is an active channel or an inactive channel during the system setup, only each of the plurality of active individual channels, and excluding any inactive individual channels, into a packet, wherein each active channel is packaged into its own packet and the packet for each active channel may be silent; and
   transmitting over a network in order to perform audio playback, by the first network device and to the second network device, the packet using bandwidth that is dynamically allocated based on the number of the packets and a variable size of the packets.

2. The method of claim 1 wherein each packet includes position and motion information for the channel included in the packet.

3. The method of claim 1 wherein best effort traffic may use allocated bandwidth when not in use by reserved traffic.

4. The method of claim 1 wherein each packet includes a channel identifier for placing the audio data included in the packet at the second network element.

5. The method of claim 1 wherein the second network device reproduces the multichannel audio data using channel identifiers and provides silence for particular channels where information is not received.

6. The method of claim 1 wherein the first network device and the second network device are comprised in a network using Audio Video Bridging/Time Sensitive Networking (AVB/TSN) standards from IEEE 802.1.

7. The method of claim 1 wherein the first network device and the second network device are communicatively coupled by an Ethernet based wired or wireless link.

8. The method of claim 1 wherein the multichannel audio data is for a single audio stream provided by a single program.

9. A first network device interconnected to a second network device, the first network device comprising:
   a processor coupled to a memory and constructed to
      divide multichannel audio data by channel into a plurality of individual channels;
      determine during a system setup whether an entirety of an individual channel from the plurality of channels is an active channel depending on whether audio is being sourced to the individual channel for each individual channel from the plurality of channels; and
      package, in response to a determination during the system setup whether each individual channel is an active channel or an inactive channel, each active channel of the plurality of individual channels together with a corresponding sampling set of audio data into a single packet, wherein each active channel is packaged into its own packet and the packet for each active channel may be silent; and
   a network interface constructed to transmit each packet that includes one of the active channels having an active sampling set of audio data over a network in order to perform audio playback using bandwidth that is dynamically allocated based on the number of the packets and a variable size of the packets.

10. The first network device of claim 9 wherein each packet includes position and motion information for the channel included in the packet.

11. The first network device of claim 9 wherein at least one packet is transmitted during each transmission period.

12. The first network device of claim 9 wherein the active sampling set of audio data includes at least one sampling instant of sound.

13. The first network device of claim 9 wherein each packet includes a channel identifier for placing the audio data included in the packet at the second network element.

14. The first network device of claim 9 wherein only packets including channels having an active sampling set of audio data are transmitted by the first network element.

15. The first network device of claim 9 wherein the first network device and the second network device are comprised in a network using Audio Video Bridging/Time Sensitive Networking (AVB/TSN) standards from IEEE 802.1.

16. The first network device of claim 9 wherein the first network device and the second network device are communicatively coupled by an Ethernet based wired or wireless link.

17. The first network device of claim 9 wherein the audio data is for a single audio stream provided by a single program.

18. A non-transitory computer-readable storage medium storing executable program instructions which when executed by a first network device interconnected to a second network device to perform a method for transporting audio data between the first network element and the second network device, the method comprising:
dividing, by the first network device, multichannel audio data by channel into a plurality of individual channels;
determining, during a system setup whether an entirety of an individual channel from the plurality of channels is an active channel depending on whether audio is being sourced to the individual channel for each individual channel from the plurality of channels;
packaging, by the first network device, in response to determining whether each individual channel is an active channel or an inactive channel during the system setup, each of the plurality of individual channels that are active channels together with a corresponding sampling set of audio data into a single packet, wherein each active channel is packaged into its own packet and the packet for each active channel may be silent; and
transmitting over a network in order to perform audio playback, by the first network device and to the second network device, each packet that includes one of the active channels having an active sampling set of audio data using bandwidth that is dynamically allocated based on the number of the packets and a variable size of the packets.

19. The non-transitory computer-readable storage medium of claim 18, wherein each packet includes position and motion information for the channel included in the packet.

20. The non-transitory computer-readable storage medium of claim 18, wherein at least one packet is transmitted during each transmission period.

21. The non-transitory computer-readable storage medium of claim 18, wherein the active sampling set of audio data includes at least one sampling instant of sound.

22. The non-transitory computer-readable storage medium of claim 18, wherein each packet includes a channel identifier for placing the audio data included in the packet at the second network element.

23. The non-transitory computer-readable storage medium of claim 18, wherein only packets including channels having an active sampling set of audio data are transmitted by the first network element.

24. The non-transitory computer-readable storage medium of claim 18, wherein the first network element and the second network element are comprised in a network using Audio Video Bridging/Time Sensitive Networking (AVB/TSN) standards from IEEE 802.1.

25. The non-transitory computer-readable storage medium of claim 18, wherein the first network element and the second network element are communicatively coupled by an Ethernet based wired or wireless link.

26. The non-transitory computer-readable storage medium of claim 18, wherein the audio data is for a single audio stream provided by a single program.

\* \* \* \* \*